United States Patent
Luo et al.

(10) Patent No.: US 10,879,848 B2
(45) Date of Patent: Dec. 29, 2020

(54) ENVELOPE TRACKING METHOD AND MOBILE TERMINAL

(71) Applicant: ZTE CORPORATION, Guangdong (CN)

(72) Inventors: Yibao Luo, Guangdong (CN); Xiao Jiang, Guangdong (CN); Fengpeng Liu, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 16/490,613

(22) PCT Filed: Dec. 29, 2017

(86) PCT No.: PCT/CN2017/120032
§ 371 (c)(1),
(2) Date: Sep. 3, 2019

(87) PCT Pub. No.: WO2018/161708
PCT Pub. Date: Sep. 13, 2018

(65) Prior Publication Data
US 2020/0021247 A1    Jan. 16, 2020

(30) Foreign Application Priority Data
Mar. 6, 2017    (CN) .......................... 2017 1 0128059

(51) Int. Cl.
H04B 1/04    (2006.01)
H03F 1/02    (2006.01)
H03F 3/24    (2006.01)

(52) U.S. Cl.
CPC ........... *H03F 1/0211* (2013.01); *H03F 3/245* (2013.01); *H04B 1/04* (2013.01); *H03F 2200/102* (2013.01); *H03F 2200/451* (2013.01); *H04B 2001/045* (2013.01); *H04B 2001/0416* (2013.01)

(58) Field of Classification Search
CPC .............. H04B 1/04; H04B 2001/0416; H04B 2001/045; H03F 1/0211; H03F 1/0227; H03F 2200/102; H03F 2200/451; H03F 3/245
See application file for complete search history.

(56) References Cited

U.S. PATENT DOCUMENTS 6,141,541 A * 10/2000 Midya ................... H03F 1/0227
                                                             455/108
2010/0014575 A1* 1/2010 Malmqvist ............... H03K 7/04
                                                              375/238

* cited by examiner

*Primary Examiner* — Nhan T Le

(57) ABSTRACT

Provided are an envelope tracking method and a mobile terminal. The envelope tracking method includes: acquiring coordinates of at least two points of an instantaneous radio frequency envelope each mapped to the same power supply voltage value; mapping the coordinates of the at least two points of the instantaneous radio frequency envelope each mapped to the same power supply voltage value to the same power supply voltage value to generate a mapping relationship; and transmitting data based on the mapping relationship.

12 Claims, 2 Drawing Sheets

ENVELOPE TRACKING METHOD AND MOBILE TERMINAL

FIELD OF THE INVENTION

The present disclosure relates to the field of communication technologies, and in particular, to an envelope tracking method and a mobile terminal.

BACKGROUND OF THE INVENTION

With the application of LTE (Long Term Evolution), mobile communication has achieved unprecedented growth in data throughput. However, the requirements for battery performance of a mobile terminal have also increased. A power amplifier is one of the devices having the highest power consumption in the mobile terminal. Envelope tracking technology can improve the efficiency of the power amplifier while ensuring the linearity of high peak-to-average power ratio input signals of the power amplifier, and its combination with pre-distortion technology can greatly reduce the communication current of the mobile terminal. However, envelope tracking sampling bandwidth of the existing envelope tracking technology is limited by operating bandwidth of an envelope tracking power supply, which results in the low data throughput of the envelope tracking technology.

SUMMARY OF THE INVENTION

The following is the summary of the subject matter detailed in the present disclosure. The summary is not intended to limit the protection scope of the claims.

Embodiments of the present disclosure provide an envelope tracking method and a mobile terminal, which solve the problem that the existing envelope tracking technology has a low data throughput.

An embodiment of the present disclosure provides an envelope tracking method, including:

acquiring coordinates of at least two points of an instantaneous radio frequency envelope each mapped to the same power supply voltage value;

mapping the coordinates of the at least two points of the instantaneous radio frequency envelope each mapped to the same power supply voltage value to the same power supply voltage value to generate a mapping relationship; and transmitting data based on the mapping relationship.

An embodiment of the present disclosure also provides a mobile terminal, including:

an acquisition module, configured to acquire coordinates of at least two points of an instantaneous radio frequency envelope each mapped to the same power supply voltage value;

a generation module, configured to map the coordinates of the at least two points of the instantaneous radio frequency envelope each mapped to the same power supply voltage value to the same power supply voltage value so as to generate a mapping relationship; and a transmission module, configured to transmit data based on the mapping relationship.

An embodiment of the present disclosure also provides a computer storage medium storing one or more programs executable by a computer, the one or more programs, when executed by the computer, causing the computer to execute the envelope tracking method provided above.

The above solutions have the following advantages or beneficial effects:

Coordinates of at least two points of an instantaneous radio frequency envelope each mapped to the same power supply voltage value are acquired; the coordinates of the at least two points of the instantaneous radio frequency envelope each mapped to the same power supply voltage value are mapped to the same power supply voltage value to generate a mapping relationship; and data is transmitted based on the mapping relationship. As such, a software algorithm is applied in the present disclosure to map the coordinates of the at least two points of the instantaneous radio frequency envelope each mapped to the same power supply voltage value are mapped to the same power supply voltage value so as to generate a mapping relationship, by mean of which compression of the instantaneous envelope signal, and the envelope tracking sampling bandwidth is equivalently increased without change the operating bandwidth of the envelope tracking power supply. In this way, the envelope tracking sampling bandwidth can carry more envelope signals while transmitting data based on the abovementioned mapping relationship, so that the throughput of data is increased.

Other aspects will be apparent upon reading and understanding the accompanying drawings and detailed descriptions.

DETAILED DESCRIPTION OF THE EMBODIMENTS

The present disclosure will be described in detail below with reference to the accompanying drawings and specific embodiments.

Figure 1:
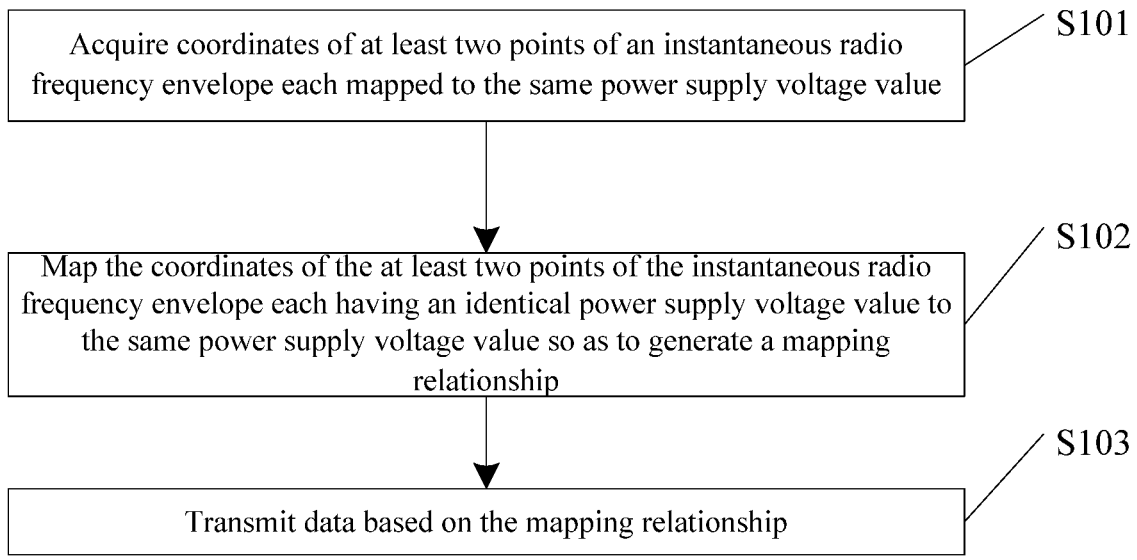
FIG. 1 is a flow chart of an envelope tracking method according to an embodiment of the present disclosure.

As shown in FIG. 1, an embodiment of the present disclosure provides an envelope tracking method, including the following steps.

Step S101, coordinates of at least two points of an instantaneous radio frequency envelope each mapped to the same power supply voltage value are acquired.

In this step, the instantaneous radio frequency envelope is a periodic signal, and the coordinates of the points of the instantaneous radio frequency envelope may be either coordinates of sampling points in the instantaneous radio frequency signal, or coordinates of points which are not sampled in the instantaneous radio frequency signal, which is not limited herein.

In an embodiment, the coordinate may include a time point and an input radio frequency signal value corresponding to the time point to calibrate a position of each point in the instantaneous radio frequency envelope signal. The input radio frequency signal value may include an amplitude value and a polarity of an input radio frequency signal, which is not limited herein.

For convenience of understanding, the embodiment of the present disclosure is exemplified by acquiring coordinates of four points of an instantaneous radio frequency envelope each mapped to the same power supply voltage value, but the acquisition number of coordinates of points of the instantaneous radio frequency envelope each mapped to the same power supply voltage value is not limited in the present disclosure. Rather, before step S102 is performed, the system may also preset a minimum and/or a maximum of the acquisition number, which may be determined according to the practical application, and is not limited herein.

Figure 3:
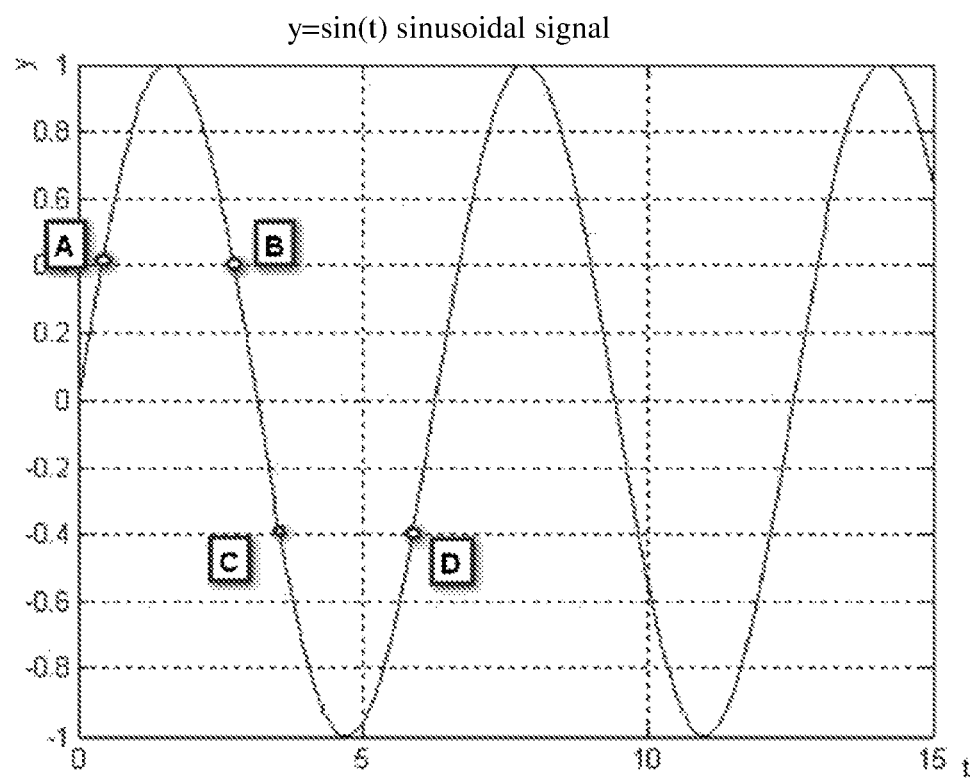
FIG. 3 is a schematic diagram of an instantaneous radio frequency envelope according to an embodiment of the present disclosure.

In the embodiment of the present disclosure, the coordinates and the power supply voltage values are respectively represented by English letters. FIG. 3 shows a schematic diagram of an instantaneous radio frequency envelope signal according to an embodiment of the present disclosure, wherein the envelope is a standard sinusoidal envelope. Because that amplitudes are identical at point A, point B, point C and point D, and that coordinate A1 of point A, coordinate B1 of point B, coordinate C1 of point C and coordinate D1 of point D each can be mapped to the same power supply voltage value, denoted as F, i.e., (A1→F), (B1→F), (C1→F), (D1→F), then in this step, the coordinates A1, B1, C1 and D1 respectively corresponding to the points A, B, C and D in the sinusoidal envelope need to be acquired. In other embodiments, the points A, B, C and D may be in different periods.

In an embodiment, step S101 may further include:

a first mapping set is generated in which the coordinates of the at least two points of the instantaneous radio frequency envelope each mapped to the same power supply voltage value are acquired, wherein the first mapping set includes coordinates of points of the instantaneous radio frequency envelope and power supply voltage values which are in a relationship of one-to-one mapping.

For example, the coordinates of points of the instantaneous radio frequency envelope signal generated by an IQ signal are first mapped to the power supply voltage values in a one-to-one manner. In an embodiment of the present disclosure, the coordinates of points of the instantaneous radio frequency envelope signal may be mapped, through an envelope profiling table, to the power supply voltage values in a one-to-one manner, wherein the envelope profiling table generally has a "de-trough" characteristic to avoid the value of the power supply voltage which tracks the instantaneous radio frequency envelope drops to 0 V. The embodiment of the present disclosure does not limit the specific implementation of one-to-one mapping between the coordinates of points of the instantaneous radio frequency envelope signal and the power supply voltage values.

After the first mapping set is generated, the coordinates of at least two points of the instantaneous radio frequency envelope each mapped to the same power supply voltage value are acquired in the first mapping set.

In an embodiment, step S101 may further include:

the coordinates of the at least two points of the instantaneous radio frequency envelope each mapped to the same power supply voltage value are acquired in a pre-obtained first mapping set, wherein the pre-obtained first mapping set includes coordinates of points of the instantaneous radio frequency envelope and power supply voltage values which are in a relationship of one-to-one mapping.

Step S102, the coordinates of the at least two points of the instantaneous radio frequency envelope each mapped to the same power supply voltage value are mapped to the same power supply voltage value to generate a mapping relationship.

In step S101, the coordinates of the at least two points of the instantaneous radio frequency envelope each mapped to the same power supply voltage value are acquired. As described in step S102, if the coordinates of four points (i.e., A1, B1, C1 and D1) of the instantaneous radio frequency envelope each mapped to the same power supply voltage value F are acquired, then A1, B1, C1 and D1 are mapped to the same power supply voltage value F in this step, i.e., (A1, B1, C1, D1→F), so as to generate a mapping relationship. As such, the power supply voltage value F is mapped to the coordinates A1, B1, C1 and D1 of the points of the instantaneous radio envelope. Compared to the one-to-one mapping, the power supply voltage value F is increased by four times of the coordinates of the mapped points of the envelope.

Step S103, data is transmitted based on the mapping relationship.

In the mapping relationship, the coordinates of the at least two points of the instantaneous radio frequency envelope each mapped to the same power supply voltage value has been mapped to the same power supply voltage value to generate a mapping relationship. Thus, when data is transmitted based on the mapping relationship, the data corresponding to the coordinates of the at least two points of the instantaneous radio frequency envelope each mapped to the same power supply voltage value can be transmitted via an envelope sampling bandwidth corresponding to the mapped same power supply voltage value, so that the envelope tracking sampling bandwidth can carry more envelope signals and transmit more data, that is, the bandwidth is equivalently increased.

In an embodiment, a second mapping set between the coordinates of points of the instantaneous radio frequency envelope and the power supply voltage values may be generated based on the mapping relationship so as to transmit data. For example, the second mapping set includes at least one mapping relationship, and the more mapping relationships are included in the second mapping set, the more envelope signals can be carried by the envelope tracking sampling bandwidth, and the more data can be thus transmitted.

Figure 2:
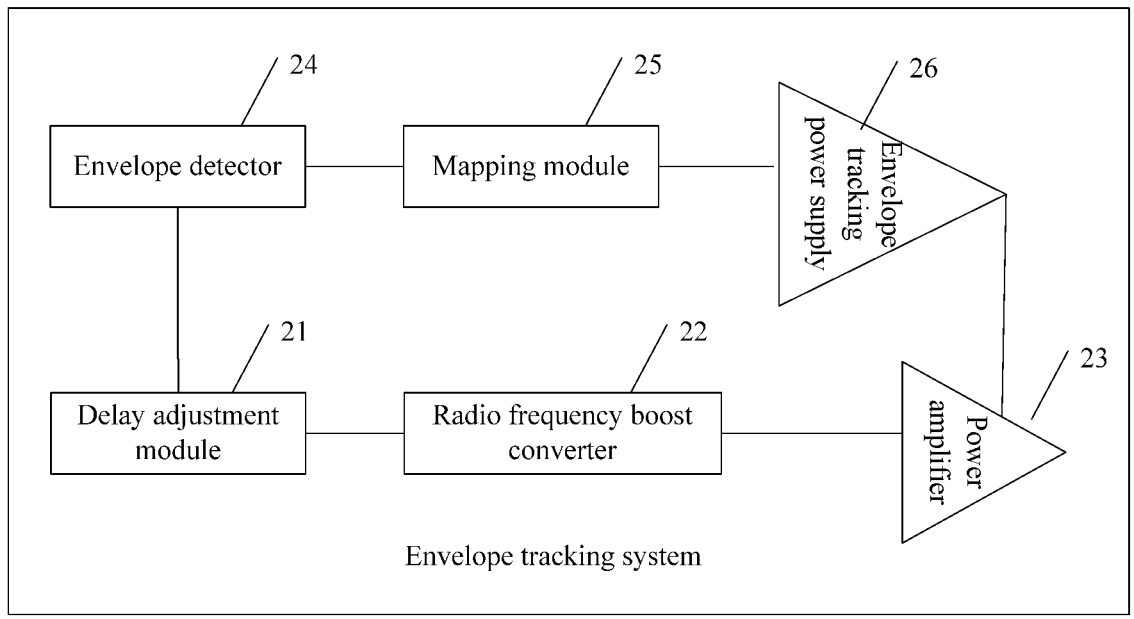
FIG. 2 is a simplified block diagram of an applicable envelope tracking system according to an embodiment of the present disclosure.

The envelope tracking method of the present embodiment is applied to an envelope tracking system as shown in FIG. 2, but is not limited to the envelope tracking system as shown in FIG. 2. FIG. 2 shows a simplified block diagram of an applicable envelope tracking system according to an embodiment of the present disclosure, including: a delay adjustment module 21, a radio frequency boost converter 22, a power amplifier 23, an envelope detector 24, a mapping module 25, and an envelope tracking power supply 26.

For example, a test envelope tracking device will input an IQ (In-phase Quadrature) signal and an envelope signal to the power amplifier 23, wherein the IQ signal is transmitted from the delay adjustment module 21 to the power amplifier 23 through the radio frequency boost converter 22. The envelope signal is an instantaneous radio frequency signal generated by the envelope detector 24 sampling absolute amplitudes of the IQ signal. Further, in order to ensure a smooth waveform, 3 to 6 times oversampling is usually used, so that power input of the power amplifier 23 can be adjusted. To maximize the efficiency of the power amplifier 23, the envelope signal (i.e., the original envelope data) output by the envelope detector 14 is mapped in the mapping module 25 to power supply voltages, and then is applied to the envelope tracking power supply 26. In this way, the voltage of the power supply applied to the power amplifier 23 is dynamically adjusted according to the "envelope" of the input signal of the power amplifier 23.

In the present embodiment, coordinates of at least two points of an instantaneous radio frequency envelope each mapped to the same power supply voltage value are acquired; the coordinates of the at least two points of the instantaneous radio frequency envelope each mapped to the same power supply voltage value are mapped to the same power supply voltage value to generate a mapping relationship; and data is transmitted based on the mapping relationship. As such, a software algorithm is applied in the present disclosure to map the coordinates of the at least two points of the instantaneous radio frequency envelope each mapped to the same power supply voltage value to the same power supply voltage value so as to generate a mapping relationship, by mean of which compression of the instantaneous envelope signal is achieved, and the envelope tracking sampling bandwidth is equivalently increased without change the operating bandwidth of the envelope tracking power supply. In this way, the envelope tracking sampling bandwidth can carry more envelope signals while transmitting data based on the above-mentioned mapping relationship, so that the throughput of data is increased.

Figure 4:
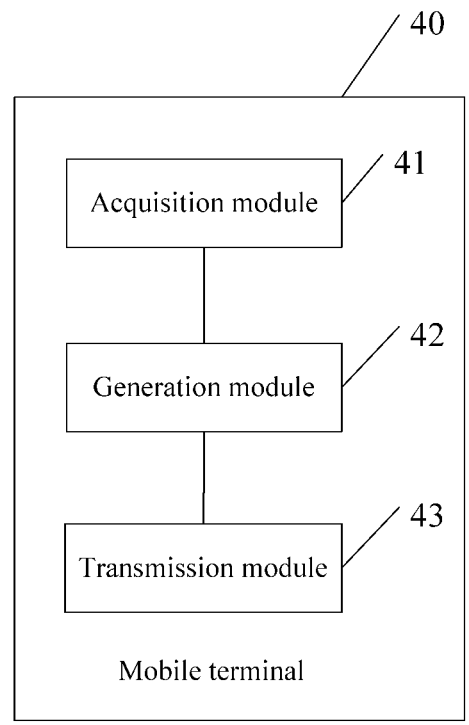
FIG. 4 is a schematic diagram of a structure of a mobile terminal according to an embodiment of the present disclosure.

FIG. 4 shows a schematic diagram of a structure of a mobile terminal according to an embodiment of the present disclosure, wherein the mobile terminal 40 includes:

an acquisition module 41, configured to acquire coordinates of at least two points of an instantaneous radio frequency envelope each mapped to the same power supply voltage value;

a generation module 42, configured to map the coordinates of the at least two points of the instantaneous radio frequency envelope each mapped to the same power supply voltage value to the same power supply voltage value to generate a mapping relationship; and a transmission module 43, configured to transmit data based on the mapping relationship.

In an embodiment, the acquisition module 41 may be further configured to generate a first mapping set in which the coordinates of the at least two points of the instantaneous radio frequency envelope each mapped to the same power supply voltage value are acquired, wherein the first mapping set includes coordinates of points of the instantaneous radio frequency envelope and power supply voltage values which are in a relationship of one-to-one mapping.

In an embodiment, the acquisition module 41 may be further configured to acquire in a pre-obtained first mapping set the coordinates of the at least two points of the instantaneous radio frequency envelope each mapped to the same power supply voltage value, wherein the pre-obtained first mapping set includes coordinates of points of the instantaneous radio frequency envelope and power supply voltage values which are in a relationship of one-to-one mapping.

In an embodiment, the transmission module 43 may be further configured to generate, based on the mapping relationship, a second mapping set between the coordinates of points of the instantaneous radio frequency envelope and the power supply voltage values so as to transmit data.

In an embodiment, the coordinate may include a time point and an input radio frequency signal value corresponding to the time point.

The mobile terminal 40 can implement the respective processes in the method embodiment of FIG. 2 and achieve the same beneficial effects. For the sake of simplicity, details are not repeated herein.

The mobile terminal according to the embodiment of the present disclosure includes: an acquisition module, configured to acquire coordinates of at least two points of an instantaneous radio frequency envelope each mapped to the same power supply voltage value; a generation module, configured to map the coordinates of the at least two points of the instantaneous radio frequency envelope each mapped to the same power supply voltage value to the same power supply voltage value to generate a mapping relationship; and a transmission module, configured to transmit data based on the mapping relationship. As such, a software algorithm is applied in the present disclosure to map the coordinates of the at least two points of the instantaneous radio frequency envelope each mapped to the same power supply voltage value are mapped to the same power supply voltage value so as to generate a mapping relationship, by mean of which compression of the instantaneous envelope signal is achieved, and the envelope tracking sampling bandwidth is equivalently increased without change the operating bandwidth of the envelope tracking power supply. In this way, the envelope tracking sampling bandwidth can carry more envelope signals while transmitting data based on the above-mentioned mapping relationship, so that the throughput of data is increased.

A person of ordinary skill in the art may understand that all or some of the steps of the method in the above embodiment may be realized by a program instructing relevant hardware. The program may be stored in a computer readable medium. The program, when executed, includes the following steps:

coordinates of at least two points of an instantaneous radio frequency envelope each mapped to the same power supply voltage value are acquired;

the coordinates of the at least two points of the instantaneous radio frequency envelope each mapped to the same power supply voltage value are mapped to the same power supply voltage value to generate a mapping relationship; and data is transmitted based on the mapping relationship.

In an embodiment, the step of acquiring coordinates of at least two points of an instantaneous radio frequency envelope each mapped to the same power supply voltage value may include that: a first mapping set is generated in which the coordinates of the at least two points of the instantaneous radio frequency envelope each mapped to the same power supply voltage value are acquired, wherein the first mapping set includes coordinates of points of the instantaneous radio frequency envelope and power supply voltage values which are in a relationship of one-to-one mapping.

In an embodiment, the step of acquiring coordinates of at least two points of an instantaneous radio frequency envelope each mapped to the same power supply voltage value may include that: the coordinates of the at least two points of the instantaneous radio frequency envelope each mapped to the same power supply voltage value are acquired in a pre-obtained first mapping set, wherein the pre-obtained first mapping set includes coordinates of points of the instantaneous radio frequency envelope and power supply voltage values which are in a relationship of one-to-one mapping.

In an embodiment, the step of transmitting data based on the mapping relationship may include that: a second mapping set between the coordinates of points of the instantaneous radio frequency envelope and the power supply voltage values is generated based on the mapping relationship so as to transmit data.

In an embodiment, the coordinate may include a time point and an input radio frequency signal value corresponding to the time point.

A person of ordinary skill in the art could appreciate that all or some of the steps of the methods and the functional modules/units in the systems or devices disclosed above may be implemented as software, firmware, hardware, and appropriate combinations thereof. In a hardware implementation, the division between the functional modules/units mentioned above does not necessarily correspond to the division of physical components. For example, one physical component may have multiple functions, or one function or step may be collaboratively executed by a plurality of physical components. Some or all of the components may be implemented as software executed by a processor, such as a digital signal processor or a microprocessor, or implemented as hardware, or implemented as an integrated circuit, such as an application-specific integrated circuit. Such software may be distributed on a computer readable medium, which may include computer storage media (or non-transitory media) and communication media (or transitory media). As known to those of ordinary skill in the art, the term computer storage medium may include volatile and nonvolatile, removable and non-removable media implemented by any method or technology for storing information (such as computer readable instructions, data structures, program modules or other data). The computer storage medium includes, but is not limited to, an RAM, an ROM, an EEPROM, a flash or other memory technology, a CD-ROM, a digital video disk (DVD) or other optical disk storage, a magnetic cartridge, a magnetic tape, a magnetic disk storage or other magnetic storage device, or any other medium that can be used to store the desired information and can be accessed by a computer. Moreover, it is well known to those of ordinary skill in the art that the communication media generally include computer readable instructions, data structures, program modules, or other data in modulated data signals such as carriers or other transmission mechanism, and may include any information transmission media.

Described above are exemplary embodiments of the present disclosure. It should be pointed out that many improvements and modifications may be further made by those of ordinary skill in the art without departing from the principle of the present disclosure, and these improvements and modifications shall fall within the protection scope of the present disclosure.

INDUSTRIAL APPLICABILITY

By using the embodiments of the present disclosure, coordinates of at least two points of an instantaneous radio frequency envelope each mapped to the same power supply voltage value are acquired; the coordinates of the at least two points of the instantaneous radio frequency envelope each mapped to the same power supply voltage value are mapped to the same power supply voltage value to generate a mapping relationship; and data is transmitted based on the mapping relationship. As such, a software algorithm is applied in the present disclosure to map the coordinates of the at least two points of the instantaneous radio frequency envelope each mapped to the same power supply voltage value to the same power supply voltage value so as to generate a mapping relationship, by mean of which compression of the instantaneous envelope signal, and the envelope tracking sampling bandwidth is equivalently increased without change the operating bandwidth of the envelope tracking power supply. In this way, the envelope tracking sampling bandwidth can carry more envelope signals while transmitting data based on the above-mentioned mapping relationship, so that the throughput of data is increased.

What is claimed is:

1. An envelope tracking method, comprising:
acquiring coordinates of at least two points of an instantaneous radio frequency envelope each having an identical power supply voltage value (S101);
mapping the coordinates of the at least two points of the instantaneous radio frequency envelope each having the identical power supply voltage value to the same power supply voltage value so as to generate a mapping relationship (S102); and
transmitting data based on the mapping relationship (S103),
wherein the step of acquiring coordinates of at least two points of an instantaneous radio frequency envelope each having an identical power supply voltage value (S101) comprises:
generating a first mapping set, and acquiring in the first mapping set the coordinates of the at least two points of the instantaneous radio frequency envelope each mapped to the same power supply voltage value, wherein the first mapping set includes coordinates of points of the instantaneous radio frequency envelope and power supply voltage values which are in a relationship of one-to-one mapping.

2. The method according to claim 1, wherein the step of acquiring coordinates of at least two points of an instantaneous radio frequency envelope each having an identical power supply voltage value (S101) comprises:
acquiring, in a pre-acquired obtained first mapping set, the coordinates of the at least two points of the instantaneous radio frequency envelope each mapped to the same power supply voltage value, wherein the pre-obtained first mapping set includes coordinates of points of the instantaneous radio frequency envelope and power supply voltage values which are in a relationship of one-to-one mapping.

3. The method according to claim 2, wherein the step of transmitting data based on the mapping relationship (S103) comprises:
generating, based on the mapping relationship, a second mapping set between the coordinates of points of the instantaneous radio frequency envelope and the power supply voltage values so as to transmit data.

4. The method according to claim 1, wherein the step of transmitting data based on the mapping relationship (S103) comprises:
generating, based on the mapping relationship, a second mapping set between the coordinates of points of the instantaneous radio frequency envelope and the power supply voltage values so as to transmit data.

5. The method according to claim 1, wherein each of the coordinates includes a time point and an input radio frequency signal value corresponding to the time point.

6. The method according to claim 1, wherein the step of transmitting data based on the mapping relationship (S103) comprises:
generating, based on the mapping relationship, a second mapping set between the coordinates of points of the instantaneous radio frequency envelope and the power supply voltage values so as to transmit data.

7. A mobile terminal (40), comprising:
an acquisition module (41), configured to acquire coordinates of at least two points of an instantaneous radio frequency envelope each having an identical power supply voltage value;
a generation module (42), configured to map the coordinates of the at least two points of the instantaneous radio frequency envelope each having the identical power supply voltage value to the same power supply voltage value so as to generate a mapping relationship; and a transmission module (43), configured to transmit data based on the mapping relationship, wherein the acquisition module (41) is further configured to generate a first mapping set in which the coordinates of the at least two points of the instantaneous radio frequency envelope each mapped to the same power supply voltage value are acquired, wherein the first mapping set comprises coordinates of points of the instantaneous radio frequency envelope and power supply voltage values which are in a relationship of one-to-one mapping.

8. The mobile terminal (40) according to claim 7, wherein the acquisition module (41) is further configured to acquire in a pre-obtained first mapping set the coordinates of the at least two points of the instantaneous radio frequency envelope each mapped to the same power supply voltage value, wherein the pre-obtained first mapping set comprises coordinates of points of the instantaneous radio frequency envelope and power supply voltage values which are in a relationship of one-to-one mapping.

9. The mobile terminal (40) according to claim 8, wherein the transmission module (43) is further configured to generate, based on the mapping relationship, a second mapping set between the coordinates of points of the instantaneous radio frequency envelope and the power supply voltage values so as to transmit data.

10. The mobile terminal (40) according to claim 7, wherein the transmission module (43) is further configured to generate, based on the mapping relationship, a second mapping set between the coordinates of points of the instantaneous radio frequency envelope and the power supply voltage values so as to transmit data.

11. The mobile terminal (40) according to claim 7, wherein each of the coordinates includes a time point and an input radio frequency signal value corresponding to the time point.

12. The mobile terminal (40) according to claim 7, wherein the transmission module (43) is further configured to generate, based on the mapping relationship, a second mapping set between the coordinates of points of the instantaneous radio frequency envelope and the power supply voltage values so as to transmit data.

\* \* \* \* \*